United States Patent [19]
Munk

[11] Patent Number: 6,066,435
[45] Date of Patent: May 23, 2000

[54] LIQUID PHOTOSENSITIVE COMPOSITION

[75] Inventor: Kurt Munk, Grenzach-Wyhlen, Germany

[73] Assignee: CIBA Specialty Chemicals Corp., Tarrytown, N.Y.

[21] Appl. No.: 09/075,638

[22] Filed: May 11, 1998

[30] Foreign Application Priority Data

Jun. 2, 1997 [CH] Switzerland ............................ 1302/97

[51] Int. Cl.[7] .................................. G03F 7/28; G03F 7/40
[52] U.S. Cl. ...................................... 430/284.1; 430/285.1; 430/907; 430/281.1; 430/910; 430/916; 430/920; 430/315; 430/320; 522/39; 522/44; 522/95; 522/120; 522/121
[58] Field of Search .............................. 430/284.1, 285.1, 430/907, 910, 916, 920, 281.1, 315, 320; 522/39, 44, 95, 120, 121

[56] References Cited

U.S. PATENT DOCUMENTS

| | | | |
|---|---|---|---|
| 4,269,933 | 5/1981 | Pazos ................................ | 430/281.1 X |
| 4,284,707 | 8/1981 | Nagasawa et al. .............. | 430/281.1 X |
| 4,370,403 | 1/1983 | Takaki ............................. | 430/281.1 X |
| 4,845,011 | 7/1989 | Wilczak et al. .......................... | 430/281.1 |
| 5,030,548 | 7/1991 | Fujikura et al. ...................... | 430/281.1 |
| 5,203,078 | 4/1993 | Nakanishi et al. ......................... | 29/843 |
| 5,284,735 | 2/1994 | Okamoto ............................... | 430/281.1 |

FOREIGN PATENT DOCUMENTS

| | | |
|---|---|---|
| 0114982 | 8/1984 | European Pat. Off. . |
| 0133908 | 3/1985 | European Pat. Off. . |
| 0726499 | 8/1996 | European Pat. Off. . |
| 0740208 | 10/1996 | European Pat. Off. . |

OTHER PUBLICATIONS

J.E. Hamlin, "New Propylene Glycol Ethers and Acetates", *Paint & Resin*, Oct. 1983, p. 542–47.

*Primary Examiner*—Cynthia Hamilton
*Attorney, Agent, or Firm*—Michele A. Kovaleski

[57] ABSTRACT

A photosensitive composition which is liquid at room temperature and which comprises a) 18 to 22% by weight of a binder polymer based on a styrene-maleic anhydride halfester copolymer, b) 10 to 15% by weight of at least one photocurable acrylate compound, c) 0.1 to 10% by weight of a photoinitiator, and d) 45 to 70% by weight of a propylene glycol halfester or propylene glycol halfester, the sum of the components a) to d) being 100% by weight, is suitable for the production of photostructured objects, preferably for the production of telephone cards.

8 Claims, No Drawings

LIQUID PHOTOSENSITIVE COMPOSITION

The present invention relates to a photosensitive composition which is liquid at room temperature and which comprises a binder polymer, at least one photocurable acrylate compound and one propylene glycol halfester or propylene glycol halfester as solvent, to the use of this composition for the production of photostructured objects, for example credit cards, identity cards or telephone cards, preferably of telephone cards based on metal-seeded plastic surfaces.

At present, dry resist films are used for the production of telephone cards. When using solid photoresists for the photostructuring, the layer thickness can be a minimum of 38 to 70 μm. Compared to liquid resists, this is a 4- to 10-fold higher layer thickness which no longer permits fine resolution of the circuit paths.

Until now, liquid resists resulted, after the development of the photoresist layer exposed to UV-light which is applied to the metal-seeded plastic surface, in residues which deactivated the seeds and interfered with the next step of current-free metal application.

It has now been found that the use of a photosensitive composition which is liquid at room temperature and which comprises a binder polymer based on a styrene-maleic anhydride halfester copolymer, at least one photocurable acrylate compound and a propylene glycol halfester or propylene glycol halfether as solvent does not result in the above disadvantages, i.e. the metal seeds present on the plastic surfaces are sufficiently active for the subsequent metallisation process following the development, especially when palladium seeds are used. The use of the novel liquid composition has the additional advantage of making it possible to work with comparatively thinner layer thicknesses, the development process following the UV irradiation of the photoresist layer thus becoming economically and ecologically more advantageous.

Accordingly, this invention relates to a photosensitive composition which is liquid at room temperature and which comprises a) 18 to 22% by weight of a binder polymer based on a styrene-maleic anhydride halfester copolymer, b) 10 to 15% by weight of at least one photocurable acrylate compound, c) 0.1 to 10% by weight of a photoinitiator, and d) 45 to 70% by weight of a propylene glycol halfester or propylene glycol halfether, the sum of the components a) to d) being 100% by weight.

The composition of this invention preferably comprises a) 18 to 22% by weight of a binder polymer based on a styrene-maleic anhydride halfester copolymer, b) 11.5 to 14.5% by weight of at least one photocurable acrylate compound, c) 1 to 5% by weight of a photoinitiator, and d) 50 to 68% by weight of a propylene glycol halfester or propylene glycol halfether.

The styrene-maleic anhydride halfester copolymers used as binder in the novel composition are known and some are commercially available, for example under the trademark Scriptset® 550 E, of Monsanto.

The styrene-maleic anhydride halfester copolymers preferably correspond to formula I

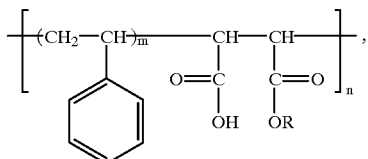

wherein R is —$CH_2OH$ or —$CH_2$—$CH_2$—OH, m is an integer from 1 to 3, and n is an integer from 6 to 8.

The novel composition preferably comprises as binder polymer a styrene-maleic anhydride halfester copolymer of the cited formula I having an average molecular weight from 10000 to 30000.

The photocurable acrylate compounds of component (b) in the composition of this invention are also known and are commercially available, for example under the trademarks SARTOMER® and EBECRYL®.

The acrylate compounds in the novel composition may be aliphatic, aromatic or cycloaliphatic di(meth)acrylates or poly(meth)acrylates having a functionality of at least 3. The acrylate compound (b) may also be urethane(meth)acrylates having a functionality of 2 to 4.

Suitable acrylate compounds (b) are, for example, the diacrylate esters and dimethacrylate esters of aliphatic or cycloaliphatic diols, such as 1,3-butylene glycol, 1,4-butanediol, neopentyl glycol, 1,6-hexanediol, diethylene glycol, triethylene glycol, tetraethylene glycol, polyethylene glycol 400, polyethylene glycol 600, tripropylene glycol, ethoxylated or propoxylated neopentyl glycol, 1,4-dihydroxymethylcyclohexane, 2,2-bis(4-hydroxycyclohexyl)propane or bis(4-hydroxycyclohexyl)methane.

Polyfunctional acrylates which may be used in the novel composition are, for example: 1,1,1-trimethylpropanetriacrylate or trimethylpropanemethacrylate, ethoxylated 1,1,1-trimethylol-propanetriacrylate or 1,1,1-trimethylolpropanemethacrylate, pentaerythritoltetraacrylate, pentaerythritolmonohydroxytriacrylate or pentaerythritolmonohydroxymethacrylate, dipentaerythritolmonohydroxytriacrylate or dipentaerythritolmonohydroxymethacrylate. Such compounds are available, for example, under the product name SR-295, SR-350, SR-351, SR-367, SR-399, SR-444 and SR-454, of Sartomer Company.

The preferred aromatic di(meth)acrylates for the novel composition are the di(meth)acrylates based on bisphenol A and bisphenol F or also the di(meth)acrylates of alkoxylated, preferably ethoxylated or propoxylated, bisphenol A or bisphenol F. Such monomeric or oligomeric di(meth)acrylates are also known and some are commercially available, for example under the product name SR-348 for ethoxylated bisphenol A dimethacrylate and under the product name SR-349 for ethoxylated bisphenol A diacrylate, of Sartomer Company.

Urethane(meth)acrylates which can be present in the novel compositions are also known to the skilled person and can be prepared in known manner by reacting, for example, hydroxylterminated polyurethane with acrylic acid or methacrylic acid to the corresponding urethane(meth)acrylate, or by reacting an isocyanate-terminated prepolymer with a hydroxyalkyl(meth)acrylate to the corresponding urethane (meth)acrylate. Such preparation processes are disclosed, inter alia, in the published EP patent applications No. 114982 and No. 133908.

Component b) in the novel composition is preferably an aliphatic acrylate, a cycloaliphatic acrylate or a urethane acrylate.

Component b) in the novel composition is particularly preferably a mixture of different preferred acrylates.

Suitable photoinitiators (c) are in principle the initiators which are customarily used for the photopolymerisation, preferably those which form free radicals upon exposure.

Typical compounds of known photoinitiators are, for example, benzoins, benzoin ethers, such as benzoin, benzoinmethyl ether, benzoinethyl ether and benzoinisopropyl ether, benzoinphenyl ether and benzoin acetate, acetophenones, such as acetophenone, 2,2-dimethylacetophenone and 1,1-dichloroacetophenone, benzil, benzilketals, such as benzildimethylketal and benzildiethylketal, which are commercially available under the trademark Irgacure®, of Ciba Spezialitatenchemie, anthraquinones, such as 2-methylanthraquinone, 2-ethylanthraquinone, 2-tert-butylanthraquinone, 1-chloroanthraquinone and 2-amylanthraquinone, triphenylphosphine, benzoylphosphine oxide (Luzirin TPO), benzophenones, such as benzophenone and 4,4'-bis(N, N'dimethylamino)benzophenone, thioxanthones and xanthones, acridine derivatives, phenazine derivatives, quinoxaline derivates or 1-phenyl-1,2-propanedione-2-O-benzoyloxime, 1-aminophenylketones or 1-hydroxyphenylketones, such as 1-hydroxycyclohexylphenylketone, phenyl-(1-hydroxyisopropyl)ketone and 4-isopropylphenyl-(1-hydroxyisopropyl)ketone, and 2-benzyl-2,2-dimethylamino-1-(4-N-morpholinophenyl)-butan-1-one, which are known compounds and some of which are commercially available.

As photoinitiator (c) it is particularly preferred to use the photoinitiators which are commercially available under the trademark Irgacure®, for example benzildimethylketal, benzildiethylketal and 2-benzyl-2,2-dimethylamino-1-(4-N-morpholinophenyl)butan-1-one.

As is known, the photoinitiators are added to the composition in effective amounts, i.e. in amount from 0.1 to 10 percent by weight, based on the total amount of the composition.

The novel composition can also comprise different photoinitiators having different radiation-sensitivity to rays having emission lines of different wavelengths. It is thus possible, for example, to make better use of a UV/VIS light source which radiates emission lines of different wavelengths.

The propylene glycol halfesters or propylene glycol halfethers, such as 1-propoxy-2-propanol, used as component (d) in the novel composition are also known compounds which are commercially available.

Component (d) in the novel composition is preferably a propylene glycol halfether.

If desired, the customary additives may be added to the novel composition, for example stabilisers, such as UV stabilisers, polymerisation inhibitors, separating agents, wetting agents, flow control agents, sensitisers, antisettling agents, surfactants, colourants, pigments or fillers.

The novel composition can be cured by irradiation with actinic light, for example by means of electron rays or X-rays, UV- or VIS-light, conveniently using light in the wavelength range from 280–650 nm.

Accordingly, this invention also relates to the use of the novel liquid photosensitive composition as photoresist for the production of photostructured objects, such as credit cards, identity cards or telephone cards, in particular for the production of telephone cards.

As mentioned at the outset, the novel composition has the advantage that it may be applied in comparatively thinner layers and that in the alkaline development of the exposed plastic sheet the exposed areas can be removed without leaving any residues so that the uncovered metal seeds are active for the subsequent metallisation. As, owing to their low layer thickness, the novel composition can additionally be used as permanent resist in the production of telephone cards, the customary stripping process is dispensed with so that the plastic sheet containing the remaining photoresist and the structured metal layer can be surface-coated immediately after the metallisation process.

Another preferred object of this invention is therefore a process for the production of telephone cards based on metal-seeded plastic surfaces, in particular on palladium-seeded plastic surfaces, which process comprises applying the novel composition to a metal-seeded plastic sheet at a layer thickness of 5–20 µm, preferably of about 10 µm, exposing it to actinic radiation through a mask providing the desired structure, developing the exposed plastic sheet in an alkaline bath and then, in a chemical metallisation bath, applying a 0.2 to 0.3 µm nickel layer to the metal seeds uncovered during the development and then, in a galvanic bath, applying a 5–20 µm Sn/Pb layer to the nickel layer such that those parts of the novel composition which remain after the development and the Sn-/Pb layer on the structured plastic sheet have the same layer thickness, and subsequently applying a coating layer to the structured plastic sheet.

Sheets or platelets consisting of palladium-seeded plastic surfaces are known and can be produced, for example, by treating the plastic sheets according to the working instruction of Atotech in a bath e.g. using a specific solution of the palladium-containing activator Neogant® 834 and then, after thorough rinsing with water, treating them further e.g. with the reductor Neogant® to obtain the metal seeds required for the subsequent metallisation.

The chemical metallisation of the metal-seeded plastic surface with a nickel layer and the galvanic metallisation of the nickel layer, e.g. with an Sn/Pb-layer, are then also carried out in known manner. The desired nickel layer is obtained, for example, by simply placing the metal-seeded plastic sheet in a metallisation bath containing a 20 to 30% nickel salt solution.

The preparation of the Sn/Pb-layer on the nickel layer is also carried out in known manner, an alloy consisting of about 60% tin and 40% lead being isolated by means of a galvanic bath e.g. from a lead/tin solution, using a cathodic current density of 1 to 8 A/dm$^2$ at 22–28° C. and at 1–3 volt.

The preparation of the coating layer on the structured plastic sheet is carried out in customary manner, for example by applying a curable surface coating layer, preferably by the spraying process.

This invention therefore also relates to telephone cards which are obtainable by the process described above.

General Preparation Instructions for a Liquid Photosensitive Composition

In a 200 liter stainless steel kettle equipped with a Pendraulic stirrer (700 to 1000 revolutions per minute), the following components are first dissolved over 10 minutes in 50 to 68 kg of 1-propoxy-2-propanol:

8 to 9 kg of the acrylate Sartomer®SR 454 (ethoxylated trimethylpropanetriacrylate, of Sartomer Company), 3 to 4 kg of the acrylate Ebecryl® 220 (oligomeric urethane acrylate, of Radcure UCB), 0.5 to 1.5 kg of acrylate NK OLIGO UA-9 P (mixture comprising 60–63% by weight of a urethane acrylate, 12–15% by weight of pentaerythritoltetraacrylate and 25% by weight of propylene glycol monoethyl ether, of Shin-Nakamura Chemical), and 0.1 to 0.2 kg of the antifoam Airex® 900 (a polysiloxane filled with quartz powder, of Tego).

To this solution are then added, with stirring, over 15 minutes 18 to 22 kg of the binder copolymer Scripset® 550 E (a styrene-maleic anhydride copolymer, of Monsanto), and are dissolved therein.

To this solution are then added 0.02 to 0.04 kg of 2,6-di-tert-butyl-p-cresol, of Shell, 0.3 to 0.8 kg of DEABP (tetraethyl-4,4-diaminobenzophenone, of BASF), 1 to 1.8 kg of the photocatalyst Irgacure® 369 (2-benzyl-2,2-dimethylamino-4'-morpholinobutyrophenone, of Ciba Spezialitätenchemie), 0.3 to 0.4 kg of the triarylmethane Pergascript Blue S-RB colourant (a bisacrylcarbazolyl-methane compound, of Ciba Spezialitätenchemie), 0.2 to 0.3 kg of triazine A ([4-(4-methoxyphenyl)-4,6-bis (trichloromethyl)-1,3,5-triazine], of PACS), and 0.1 to 0.5 kg of Orasolblau GN (copper phthalocyanine isopropyl-3-sulfonamide, of Ciba Spezialitätenchemie).

The mixture so obtained is homogenised for 60 minutes with stirring, the temperature of the mixture being kept below 35° C.

EXAMPLE 1

The following substances are used in analogy to the general preparation instructions:

6.934 kg of the acrylate Sartomer®SR 454 (ethoxylated trimethylpropanetriacrylate, of Sartomer Company), 6.892 kg of the acrylate Ebecryl® 220 (polymeric urethane acrylate, of Radcure UCB), 2.100 kg of the acrylate NK OLIGO UA-9 P (mixture comprising 60–63% by weight of a urethane acrylate, 12–15% by weight of pentaerythritoltetraacrylate and 25% by weight of propylene glycol monoethyl ether, of Shin-Nakamura Chemical), and 0.310 kg of the antifoam Airex® 900 (a polysiloxane filled with silicic acid, of Tego)

and are dissolved, with stirring, over 10 minutes in 60.743 kg of 1 propoxy-2-propanol.

To this solution are slowly added, with stirring, over about 15 minutes 17.562 kg of the binder copolymer Scripset® 550 E (a styrene-maleic anhydride copolymer, of Monsanto). Subsequently, there are added 0.029 kg of 2,6-di-tert-butyl-p-cresol, 0.740 kg of tetraethyl-4,4-diaminobenzophenone (DEABP, of BASF), 1.780 kg of the photocatalyst Irgacure® 369 (2-benzyl-2,2-dimethylamino-4'-morpholinobutyrophenone, of Ciba Spezialitätenchemie), 0.400 kg of the triarylmethane Pergascript Blue S-RB colourant (a bisacrylcarbazolylmethane compound, of Ciba Spezialitätenchemie), 0.300 kg of 4-(4-methoxyphenyl)-4,6-bis (trichloromethyl)-1,3,5-triazine, and 0.400 kg of copper phthalocyanine isopropyl-3-sulfonamide (Orasolblau GN, of Ciba Spezialit ätenchemie).

The mixture so obtained is homogenised for 60 minutes with stirring, the temperature of the mixture being kept below 35° C.

viscosity at 25° C.=0.285 Pa·s exposure=120mJ/cm$^2$ development in 1.0% aqueous $Na_2CO_3$ solution at 30° C. for 30 seconds resolution=12 µm line and gap Stouffer steps=7 (maximum 21).

EXAMPLE 2

The following substances are used in analogy to the general preparation instructions:

4.123 kg of the acrylate Sartomer®SR 454 (ethoxylated trimethylpropanetriacrylate, of Sartomer Company), 8.672 kg of the acrylate Ebecryl® 220 (polymeric urethane acrylate, of Radcure UCB), 1.100 kg of acrylate NK OLIGO UA-9 P (mixture comprising 60–63% by weight of a urethane acrylate, 12–15% by weight of pentaerythritoltetraacrylate and 25% by weight of propylene glycol monoethyl ether, of Shin-Nakamura Chemical), and 0.310 kg of the antifoam Airex® 900 (a polysiloxane filled with silicic acid, of Tego), and are dissolved, with stirring, over 10 minutes in 62.553 kg of 1 propoxy-2-propanol.

To this solution are added slowly, with stirring, over about 15 minutes 19.272 kg of the binder copolymer Scripset 550 E (a styrene-maleic anhydride copolymer, of Monsanto). Subsequently, there are added 0.029 kg of 2,6-di-tert-butyl-p-cresol, 0.740 kg of tetraethyl-4,4-diaminobenzophenone (DEABP, of BASF), 1.780 kg of the photocatalyst Irgacure® 369 (2-benzyl-2,2-dimethylamino-4'-morpholinobutyrophenone, of Ciba Spezialitätenchemie), 0.400 kg of the triarylmethane Pergascript Blue S-RB colourant (a bisacrylcarbazolylmethane compound, of Ciba Spezialitatenchemie), 0.300 kg of 4-(4-methoxyphenyl)-4,6-bis (trichloromethyl)-1,3,5-triazine, and 0.400 kg of copper phthalocyanine isopropyl-3-sulfonamide (Orasolblau GN, of Ciba Spezialit ätenchemie).

The mixture so obtained is homogenised, with stirring, over 60 minutes, the temperature of the mixture being kept below 35° C.

viscosity at 25° C.=0.234 Pa·s exposure=120 m J/cm$^2$ development 1.0% aqueous $Na_2CO_3$ solution at 30° C. for 30 seconds resolution=15 µm line and gap Stouffer steps=7 (maximum 21).

Use Example

Production of a Telephone Card

Using a double-sided roll coater, the dissolved composition prepared in Example 1 is coated on a palladium-seeded ABS sheet, produced according to the working instruction of ATOTECH using activator Neoganth® 834 and reductor Neoganth®. After drying the composition in an oven at 80° C. for 4 minutes, the film so obtained has a layer thickness of 10 µm.

The dried film sheet is then exposed to UV-light through an imaging mask, using radiant energy of 150 to 250 mJ/cm². The exposed sheet is then developed in a 0.66 to 0.86% taining a 20–30% NiCl₂ solution, a 0.2 to 0.3 µm nickel layer is then applied in 2 minutes to the uncovered palladium seeds and then, in a galvanic bath containing tin solution Sulfolyt® and lead solution Sulfolyt®, of ATOTECH, and at a current density of 1–8 A/dm², at 1–3 volt and at 22–28° C., a 10 µm Sn/Pb-layer is applied to the nickel layer, the ABS sheet having equally thick resist and metal layers, so that a stripping process for the removal of the resist layer may be dispensed with. The ABS sheet structured in this manner is then surface-coated, resulting in the finished telephone card.

What is claimed is:

1. A photosensitive composition which is liquid at room temperature and which comprises a) 18 to 22% by weight of a styrene-maleic anhydride halfester copolymer as binder,
    b) 10 to 15% by weight of at least one photocurable acrylate compound,
    c) 0.1 to 10% by weight of a photoinitiator, and
    d) 45 to 70% by weight of a propylene glycol halfester or propylene glycol halfether, the sum of the components a) to d) being 100% by weight.

2. A composition according to claim 1, which comprises b) 11.5 to 14.5% by weight of at least one photocurable acrylate compound,
    c) 1 to 5% by weight of a photoinitiator, and
    d) 50 to 68% by weight of a propylene glycol halfester or propylene glycol halfether.

3. A composition according to claim 1, wherein component a) is a styrene-maleic halfester of formula I

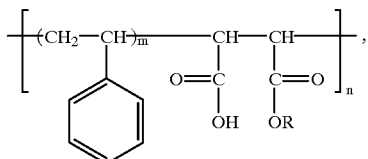

wherein R is —CH₂OH or —CH₂—CH₂—OH, m is an integer from 1 to 3, and n is an integer from 6 to 8.

4. A composition according to claim 1, wherein component b) is an aliphatic acrylate, a cycloaliphatic acrylate or a urethane acrylate.

5. A composition according to claim 4, wherein component b) is a mixture of different acrylates.

6. A composition according to claim 1, wherein component c) is a photoinitiator which forms free radicals upon exposure.

7. A composition according to claim 1, wherein component c) is benzildimethylketal, benzildiethylketal or 2-benzyl-2,2-dimethylamino-1-(4-N-morpholinophenyl) butan-1-one.

8. Process for the production of telephone cards from metal-seeded plastic surfaces, which process comprises applying the composition claimed in claim 1 to a metal-seeded plastic sheet at a layer thickness of 5–20 µm, exposing it to actinic radiation through a mask providing the desired structure, developing the exposed plastic sheet in an alkaline bath and then, in a chemical metallisation bath, applying a 0.2 to 0.3 µm nickel layer to the metal seeds uncovered during the development and then, in a galvanic bath, applying a 5–20 µm Sn/Pb layer to the nickel layer such that those parts of the novel composition which remain after the development and the Sn-/Pb layer on the structured plastic sheet have the same layer thickness, and subsequently applying a coating layer to the structured plastic sheet.

* * * * *